United States Patent [19]
Yanagisawa

[11] Patent Number: 4,707,625
[45] Date of Patent: Nov. 17, 1987

[54] SEMICONDUCTOR INTEGRATED CIRCUIT DEVICE FORMED WITH A CMOS CIRCUIT AND A BOATSTRAP CAPACITOR

[75] Inventor: Kazumasa Yanagisawa, Kokubunji, Japan

[73] Assignee: Hitachi, Ltd., Tokyo, Japan

[21] Appl. No.: 712,141

[22] Filed: Mar. 15, 1985

[30] Foreign Application Priority Data

Mar. 26, 1984 [JP] Japan .................................. 59-56027

[51] Int. Cl.[4] ...................... H03K 4/58; H03K 3/013; H03K 3/353; H03K 17/10
[52] U.S. Cl. .................................... 307/578; 307/482; 307/579; 307/585; 307/443; 307/452; 307/446; 365/203
[58] Field of Search ............... 307/443, 451, 452, 453, 307/469, 482, 270, 279, 571, 576, 577, 578, 579, 583, 585, 446; 365/104, 156, 181, 190, 203

[56] References Cited

U.S. PATENT DOCUMENTS 4,387,308  6/1983  Nagami ........................... 307/578 X
4,468,576  8/1984  Takemae ......................... 307/578 X
4,482,825  11/1984  Nozaki et al. ....................... 307/578
4,584,491  4/1986  Ulmer ............................. 307/579 X

FOREIGN PATENT DOCUMENTS 2659221  7/1977  Fed. Rep. of Germany ...... 307/443
0158129  9/1984  Japan .................................. 307/579
0075127  4/1985  Japan .................................. 307/452
1023659  6/1983  U.S.S.R. ............................. 307/448

Primary Examiner—Stanley D. Miller
Assistant Examiner—David R. Bertelson
Attorney, Agent, or Firm—Antonelli, Terry & Wands

[57] ABSTRACT

A circuit is formed with a combination of a CMOS circuit and a bootstrap capacitor connected to an output terminal of the CMOS circuit in order to reduce the power consumption and to obtain, at the output terminal, a high output voltage exceeding a power supply voltage. In order to prevent the discharge of the bootstrap capacitor, a switching element for preventing a reverse biasing state of the MOSFET on the power supply side of the CMOS circuit is connected in series with the MOSFET.

37 Claims, 14 Drawing Figures

SEMICONDUCTOR INTEGRATED CIRCUIT DEVICE FORMED WITH A CMOS CIRCUIT AND A BOATSTRAP CAPACITOR

FIELD OF THE INVENTION

The present invention relates to a semiconductor integrated circuit device, and particularly to a technique that is effective when adapted to a semiconductor integrated circuit device which includes a bootstrap circuit constituted by a CMOS (complementary MOS) circuit.

BACKGROUND OF THE INVENTION

The applicant of the present application has previously developed a timing generator circuit as shown in FIG. 1 that can be used, for example, for a dynamic RAM (random-access memory). In this timing generator circuit, a bootstrap voltage is shaped by utilizing an input timing signal $\phi_{in}$ and an inverted delay signal thereof, and an output MOSFET Q55 on the power-source voltage side is driven to obtain an output signal at the level of the power-source voltage. According to this timing generator circuit, an output of a predetermined low level is formed when push-pull MOSFETs Q53, Q54 and output MOSFETs Q55, Q56 in a drive stage and an output stage are turned on during a delay time defined from when the input timing signal $\phi_{in}$ reaches a high level to when the inverted delay signal thereof reaches a low level. Therefore, a relatively large through-current flows, resulting in an increased consumption of current. When the output terminal is provided with a bootstrap capacitor CB2 to raise the output signal to a level higher than that of the power-source voltage $V_{CC}$, a MOSFET Q57 which is supplied with the power-source voltage $V_{CC}$ at all times through the gate thereof is also provided, to ensure the withstand voltage of the output MOSFET Q56 with respect to high-level output signals. In order to produce a low-level output as described above, therefore, the ratio of the conductance of the MOSFET Q55 on the power-source voltage side to the total conductance of the serially connected MOSFETs Q56, Q57 must be large. Therefore, the size of the output MOSFETs Q56, Q57 on the ground-potential side must be extremely large, necessitating a relatively large layout area therefor.

A dynamic RAM which requests such a timing generator circuit is described in detail in Japanese Patent Laid-Open No. 82282/1982 and Japanese patent application No. 164831/1982.

OBJECT OF THE INVENTION

An object of the present invention is to provide a semiconductor integrated circuit device including a bootstrap circuit which consumes a reduced quantity of power.

Another object of the present invention is to provide a semiconductor integrated circuit device including a bootstrap circuit which realized a high degree of integration.

These and other objects as well as novel features of the present invention will become obvious from the description of the specification and the accompanying drawings.

SUMMARY OF THE INVENTION

One embodiment of the invention disclosed in this application is briefly described below. The bootstrap circuit comprises a first MOSFET (for example, Q60) of a first conductivity type which receives an input timing signal through the gate thereof, and which has a source connected to a power-source voltage terminal. The bootstrap circuit also includes a switching element or a current inhibiting element to inhibit a reverse bias state of the first MOSFET. This switching or current inhibiting element can comprise a MOSFET such as Q61 of a second conductivity type which is connected in series with the first MOSFET to constitute, together with the first MOSFET, an output circuit on the power-source voltage side. A transfer-gate MOSFET such as Q64 of the second conductivity type is also provided for capacitor-cutting. This transfer-gate MOSFET transfers an output signal from a CMOS inverter circuit to the gate of MOSFET Q61. The CMOS inverter circuit receives a signal in synchronism with a bootstrap-start timing signal. The bootstrap circuit further includes a MOSFET Q63 of the second conductivity type which receives the input timing signal through the gate thereof and which constitutes an output circuit on the ground-potential side. Finally, a bootstrap capacitor CB is included which has one terminal connected to the source of the MOSFET Q61, and which receives the bootstrap-start timing signal through the other terminal thereof. Other embodiments are also described which include alternative arrangements for the switching or current inhibiting element.

DETAILED DESCRIPTION

Figure 2A:
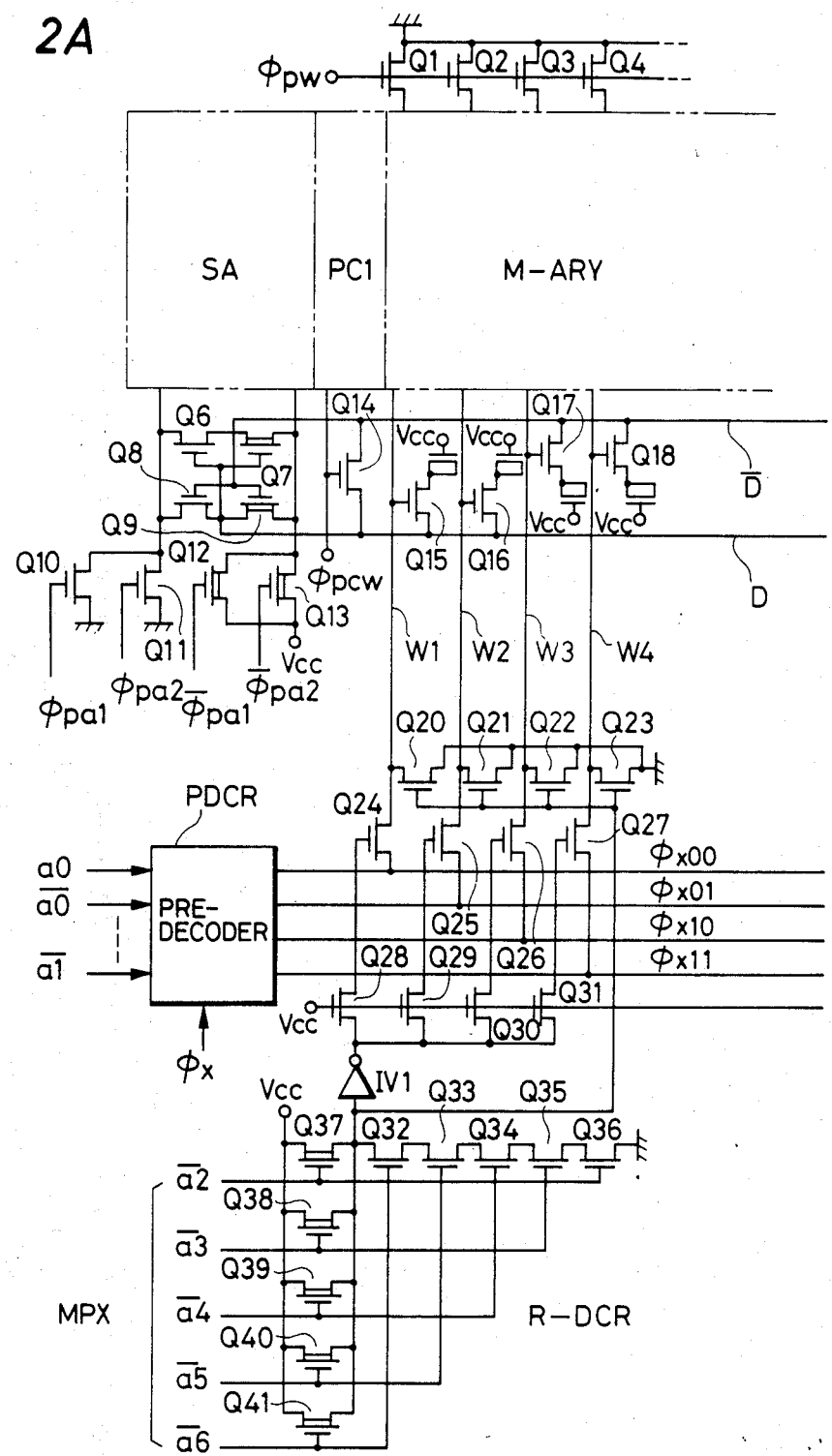
FIGS. 2A and 2B are circuit diagrams of a semiconductor memory device according to an embodiment of the present invention.
Figure 2B:
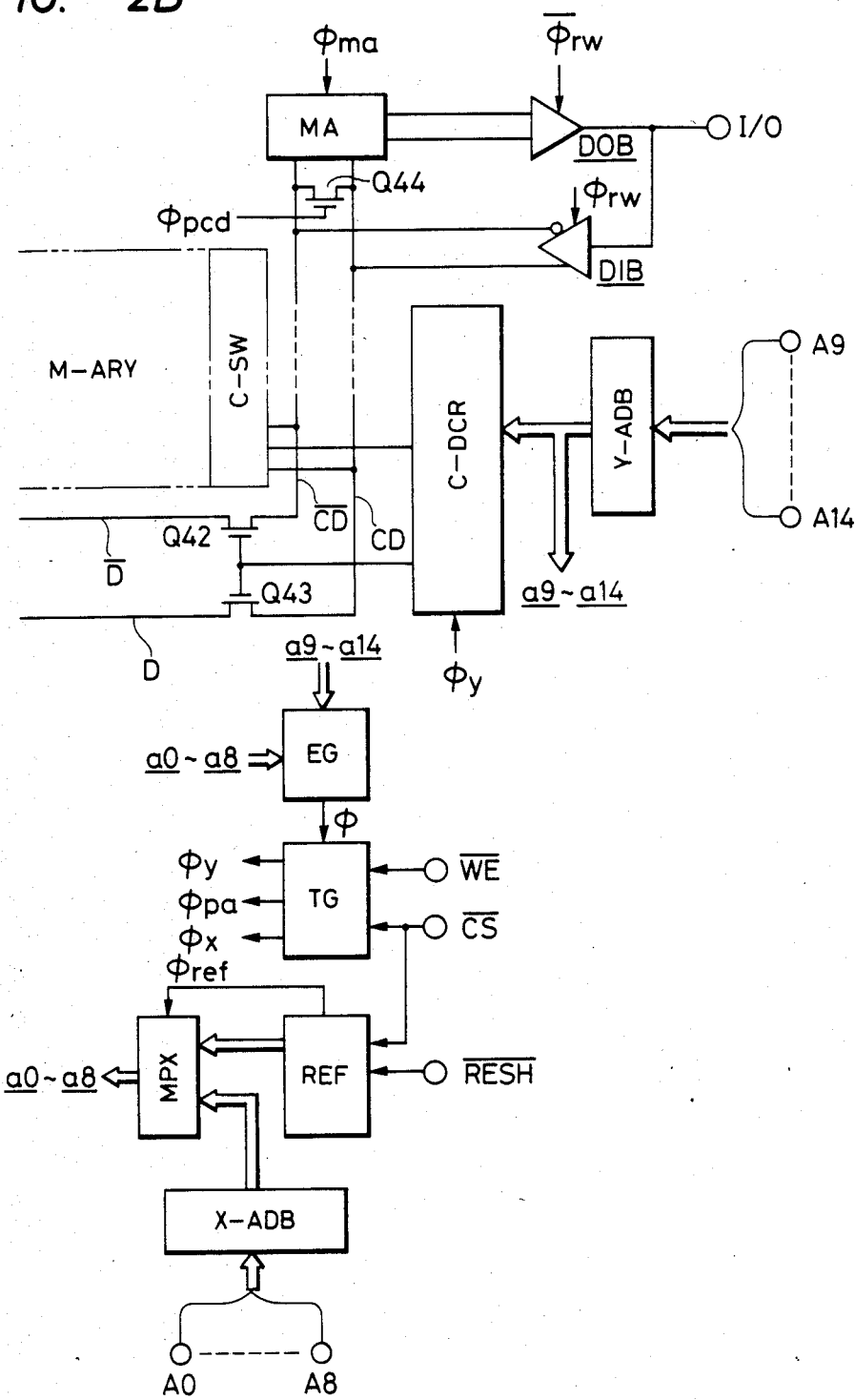

FIGS. 2A and 2B show a circuit diagram of a dynamic RAM in which the bootstrap circuit of the present invention can be used. In these figures, a memory array M-ARY is constituted by dynamic memory cells, and peripheral circuits thereof shown in the drawings are constituted by CMOS static circuits. The circuit elements are formed on a semiconductor substrate, such as a silicon crystal, by conventional techniques for producing MOS integrated circuits.

In the embodiment, N-channel MOSFETs are formed on a P-type semiconductor substrate of a single crystalline silicon, and P-channel MOSFETs are formed on N-well regions which are formed on the semiconductor substrate by using such techniques as local oxidation technique and self-alignment. In the device, the semiconductor substrate acts as a common substrate gate electrode of the N-channel MOSFETs, and the N-well regions act as substrate gate electrodes of the P-channel MOSFETs. The semiconductor substrate is held at a ground potential (first reference potential) of the circuit and the N-well regions are held at a power supply voltage $V_{CC}$ (about +5 V) of the circuit. In the following description, the MOSFETs (insulated-gate field-effect transistors) are all of the N-channel type, unless otherwise stated.

Examples of memory cells within memory array M-ARY are represented in FIGS. 2A and 2B by a pair of rows, in which input/output nodes of a plurality of memory cells constituted by MOSFETs Q15 to Q18 for selecting the address and MOS capacitors for storing data are connected to a pair of parallel complementary data lines D, $\overline{D}$, maintaining a predetermined regularity.

Although there is no particular limitation thereon, a precharging circuit PC1 consists of, for example, a switching MOSFET Q14 which is connected between the complementary data lines D and $\overline{D}$.

A sense amplifier SA is shown as consisting of a CMOS (complementary MOS) latch circuit made up of P-channel MOSFETs Q7, Q9 and N-channel MOSFETs Q6, Q8, shown as typical examples, and a pair of input/output nodes thereof are connected to the complementary data lines D, $\overline{D}$. In addition, although there is no particular limitation thereon, a latch circuit is supplied with a power-source voltage $V_{CC}$ through P-channel MOSFETs Q12, Q13 that are connected in parallel, and is also supplied with a ground voltage $V_{SS}$ of the circuit through N-channel MOSFETs Q10, Q11 that are connected in parallel. These power-switching MOSFETs Q10, Q11 and MOSFETs Q12, Q13 are also used in common for other sense amplifiers SA that are similarly provided for other rows.

Complementary timing pulses $\phi_{pa1}$, $\overline{\phi}_{pa1}$ are inputted to the gates of MOSFETs Q10, Q12 to activate the sense amplifier SA, and complementary timing pulses $\phi_{pa2}$, $\overline{\phi}_{pa2}$ that lag behind the timing pulses $\phi_{pa1}$, $\overline{\phi}_{pa1}$ are inputted to the gates of MOSFETs Q11 and Q13. This is because, when the sense amplifier SA is operated by a very small read voltage from a memory cell, the flow of current is limited by the MOSFETs Q10, Q12 which have relatively small conductances, so that the level of the data line is prevented from dropping. After the potential difference between the complementary data lines has been increased by this amplification operation, the MOSFETs Q11, Q13, which have relatively large conductances, are turned on to speed up the amplification. Thus, the amplification of the sense amplifier SA is divided into two stages, in order to read out data at high speed while preventing the level of the higher-side complementary data line from dropping.

A row decoder R-DCR is represented in the figure as covering one circuit portion (i.e. a portion for four word lines). Word line select signals for the four word lines are shaped by a NAND circuit consisting of a CMOS circuit made up of N-channel MOSFETs Q32 to Q36 and P-channel MOSFETs Q37 to Q41 that receive address signals $\overline{a2}$ to $\overline{a6}$.

The output of the NAND circuit is inverted by a CMOS inverter IV1, and is transmitted to the gates of MOSFETs Q24 to Q27 through cutting MOSFETs Q28 to Q31.

Although there is no particular limitation thereon, four word line select timing signals $\phi_{x00}$ to $\phi_{x11}$ produced by combinations of a word line select timing signal $\phi_x$ and decoded signals of 2-bit complementary address signals a0, a1 are transmitted to each of the word lines through MOSFETs Q24 to Q27. Here, the non-inverted address signal a0 and an inverted address signal $\overline{a0}$ are expressed by the complementary address signal a0. The other complementary address signals are expressed in a similar manner. The signals $\phi_{x00}$ to $\phi_{x11}$ are provided by a pre-decoder PDCR which decodes the internal complementary address signals a0, $\overline{a0}$, a1, and $\overline{a1}$, to generate signals $\phi_{x00}$ to $\phi_{x11}$ in synchronism with the word selection signal $\phi_x$. Details of the pre-decoder PDCR are shown in FIG. 5.

Figure 5:
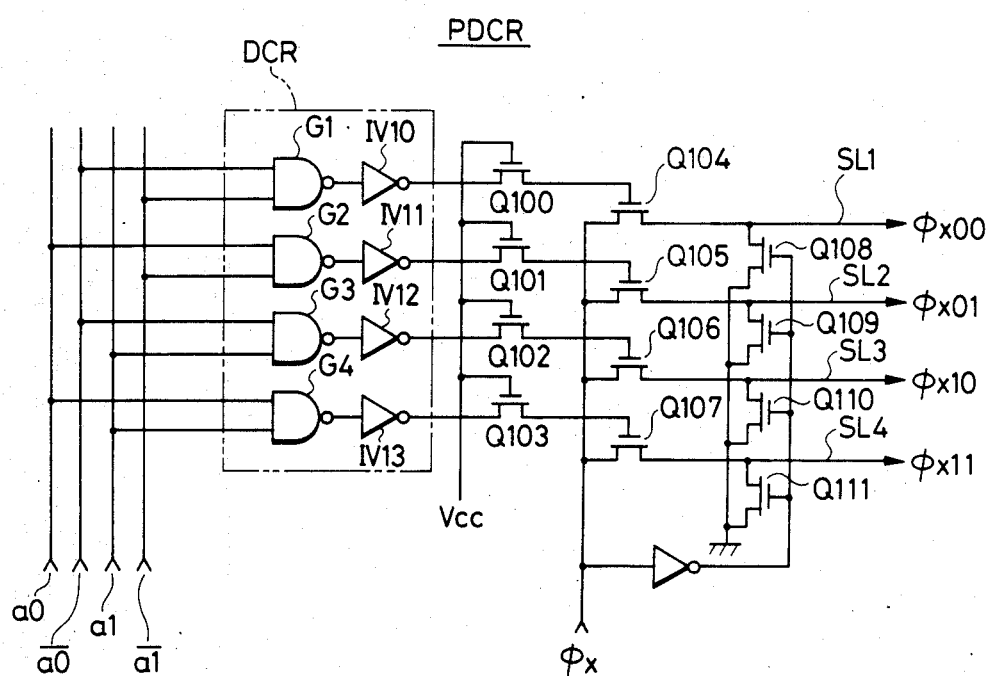
FIG. 5 is a diagram illustrating the circuit PDCR of FIG. 2A in detail.

Referring to FIG. 5, although the invention is not limited thereto, the pre-decoder PDCR can be comprised of a decoder portion DCR (CMOS NAND circuits $G_1$ to $G_4$, and CMOS inverters $IV_{10}$ to $IV_{13}$), cutting MOSFETs $Q_{100}$ to $Q_{103}$ of N-channel conductivity type, transferring MOSFETs $Q_{104}$ to $Q_{107}$ of N-channel conductivity type, resetting MOSFETs $Q_{108}$ to $Q_{111}$ of N-channel conductivity type, and a CMOS inverter $IV_{14}$.

The circuit operation of the PDCR shown in FIG. 5 is as follows:

When the word selection signal $\phi_x$ is held to the low level, the output signals $\phi_{x00}$ to $\phi_{x11}$ of the selection lines $SL_1$ to $SL_4$ are held to the low level since the resetting MOSFETs $Q_{108}$ to $Q_{111}$ are driven to their ON states by the high output level (about the power supply voltage $V_{CC}$) of the inverter $IV_{14}$.

When the signal $\phi_x$ is raised to the high level, one of the output signals $\phi_{x00}$ to $\phi_{x11}$ is raised to the high level. Namely, if the internal address signals $\overline{a_0}$ and $\overline{a_1}$ assume the high level (about $V_{CC}$), the transfer MOSFET $Q_{104}$ is held to the ON state, and the $\phi_x$ is transferred to the line $\overline{SL_1}$ through the MOSFET $Q_{104}$. In accordance with this, the $\phi_{x00}$ is raised to the high level. Remaining signals $\phi_{x01}$ to $\phi_{x11}$ are held to the low level since MOSFETs $Q_{105}$ to $Q_{107}$ are driven to their OFF state by the DCR.

Here, the MOSFET $Q_{104}$ in the ON state has a large gate capacitance between the gate electrode and a channel region induced at the semiconductor surface under the gate electrode. The gate capacitance acts as a self-bootstrap capacitor. Therefore, when the signal $\phi_x$ is raised to the high level, the gate of $Q_{104}$ is boosted to a higher level than the high level of the signal $\phi_x$, and the signal $\phi_x$ is transferred to the line $SL_1$ without any voltage loss. At the time, the cutting MOSFET $Q_{100}$ is automatically cut off by the boosted voltage of the gate of $Q_{104}$. Remaining MOSFETs $Q_{105}$ to $Q_{107}$ have a small gate capacitance since there are no channel regions induced under their gates by the low output levels of the DCR.

Returning to FIGS. 2A and 2B, MOSFETs Q20 to Q23 are provided between the word lines and ground potential, and the gates thereof are supplied with the output of the NAND circuit, so that word lines that are not selected are held at ground potential. The word lines are provided with reset MOSFETs Q1 to Q4 which are turned on by the receipt of a reset pulse $\phi_{pw}$, to reset the selected word lines to ground level.

A column switch C-SW, which is represented in the figure by MOSFETs Q42, Q43, acts to selectively connect the complementary data lines D, $\overline{D}$ and common complementary data lines CD, $\overline{CD}$. A select signal from the column decoder C-DCR is inputted to the gates of these MOSFETs Q42, Q43. The column decoder C-DCR decodes address signals received from the column address buffer Y-ADB which receives input address signals A9 to A14 and converts these to signals $a_9$ to $a_{14}$.

A precharging MOSFET Q44, which constitutes a precharging circuit PC2 similar to the one described above, is provided between common complementary data lines CD, $\overline{CD}$ to which are connected a pair of input/output nodes of a main amplifier MA which is constructed in the same manner as the sense amplifier SA. In the same figure, DIB denotes a data input buffer, and DOB a data output buffer.

Although there is no particular limitation thereon, an automatic refresh circuit REF contains an address counter which forms a refresh address signal, and a timer circuit which starts to operate when a refresh control signal $\overline{RESH}$ sent through an external terminal reaches a low level. That is, if the refresh control signal $\overline{RESH}$ reaches a low level when the chip select signal $\overline{CS}$ is at a high level, the automatic refresh circuit REF generates a signal $\phi_{ref}$ for switching the multiplexer MPX to the side of the address counter. The multiplexer MPX is also coupled to receive the output signals a0 to a8 of the row address buffer X-ADB which converts input address signals $A_0$ to $A_8$ to the signals a0 to a8. The internal complementary address signals a0 to a8 shaped by the address counter are sent to the address decoder R-DCR, where one word line is selected to effect the refresh operation (automatic refresh operation). The address counter increments upon receipt of each refresh control signal $\overline{RESH}$. By repeating these operations for the number of word lines, therefore, all the memory cells can be refreshed. If the refresh control signal $\overline{RESH}$ is maintained at its low level, the timer circuit generates a pulse after each predetermined time interval to increment the address counter, so that the refresh operation is performed continuously during this period.

In the RAM of this embodiment, changes in complementary address signals a0 to a9. amd 9 to a14 are detected by an address signal change detector circuit EG. Based upon a detection signal $\phi$ generated by the address signal change detector circuit EG, a write enable signal $\overline{WE}$, and a chip select signal $\overline{CS}$, a timing generator circuit TG generates all the internal timing signals required for the write, read, and refresh operations. Therefore, timing control from external equipment can be simplified, and the device can be handled easily like a static RAM. Since the memory cells are comprised with one-MOS type of a dynamic type, the memory capacity can be increased. In addition, when the operation of precharging the memory array is at an intermediate level of about $V_{CC}/2$, by simply short-circuiting the pair of complementary data lines and the pair of common complementary data lines, the charge level can be kept small compared with a system in which the charging is effected from 0 to $V_{CC}$.

The precharging MOSFET can be turned on when not saturated, even when an ordinary logic level ($V_{CC}$) is applied to the gate thereof. Accordingly, the precharging can be done at high speed, and the consumption of power can be reduced. Thus, when the precharge level is selected to be an intermediate level which is approximately $V_{CC}/2$, the MOSFET for selecting the address in the memory cells can be turned on when not saturated, even when the ordinary logic level ($V_{CC}$) is used as the gate voltage (word line select voltage), and the memory cells can be read at high speed. A reference voltage for the read is based upon the precharge level of a data line that does not select the memory cell. Therefore, there is no need to employ a dummy cell to generate the reference voltage for reading.

When rewriting data into a selected memory cell, however, if the level of the word line is maintained the same as the power-source voltage $V_{CC}$, the level at which the data is written into the data-storage capacitor decreases by a quantity corresponding to the threshold voltage of the MOSFET Q15 for selecting the address. When rewriting data after a read operation has been finished, therefore, the word line select level must be kept higher than the power-source voltage $V_{CC}$.

Figure 3:
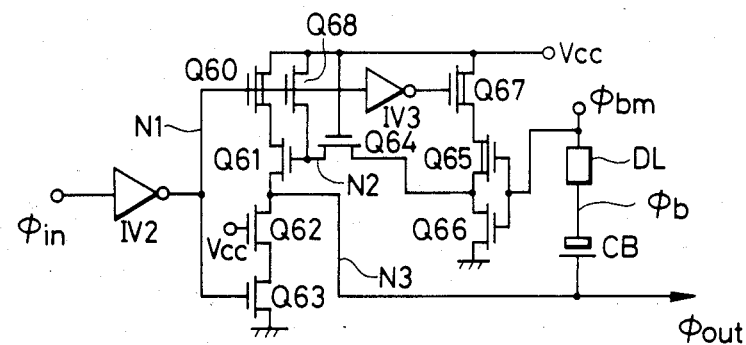
FIG. 3 is a diagram of a first embodiment of a bootstrap circuit used as a timing generator circuit according to the present invention.

FIG. 3 is a diagram of a preferred embodiment of a bootstrap circuit which is used to raise the level of timing signals, such as the word line select timing signal $\phi_x$, to a level higher than the power-source voltage, constructed in accordance with the present invention.

Although there is no particular limitation thereon in this embodiment, the input timing signal $\phi_{in}$ is inverted by a CMOS inverter circuit IV2, and is supplied as an input signal to the next bootstrap circuit. Namely, the inverted input timing signal is inputted to the gate of a P-channel MOSFET Q60 which forms part of an output circuit on the power-source voltage side. An N-channel MOSFET Q61 is connected in series with the MOSFET Q60 to form part of the output circuit on the power-source voltage side. N-channel MOSFETs Q62, Q63 that constitute an output circuit on the ground-potential side are provided in series between the source of the N-channel MOSFET Q61 and the point of ground potential. The power-source voltage $V_{CC}$ is applied at all times to the gate of MOSFET Q62 to increase the drain withstand voltage of output MOSFET Q63 on the ground-potential side. That is, as will be described later, when the output signal $\phi_{out}$ obtained from the source of MOSFET Q61 is raised by the bootstrap effect to higher than the power-source voltage $V_{CC}$, the drain voltage of MOSFET Q63 is suppressed so that it does to exceed the power-source voltage $V_{CC}$ less $V_{th}$ (the threshold voltage of MOSFET Q62). The inverted input timing signal is supplied to the gate of the output MOSFET Q63.

An output signal form the CMOS inverter circuit, which receives a signal $\phi_{bm}$ in synchronism with a bootstrap-start timing signal $\phi_b$, is supplied to the gate of the output MOSFET Q61 through an N-channel transfer-gate MOSFET Q64 whose gate is supplied with the power-source voltage $V_{CC}$ at all times. Although there is no particular limitation thereon, the bootstrap-start timing signal $\phi_b$ is generated from a delay circuit DL which is supplied with the signal $\phi_{bm}$, so that the bootstrap-start timing signal $\phi_b$ is delayed with respect to the signal $\phi_{bm}$. The CMOS inverter circuit consists of a P-channel MOSFET Q65 and an N-channel MOSFET Q66. According to this embodiment, although there is no particular limitation thereon, a P-channel MOSFET Q67 is provided between the power-source voltage $V_{CC}$ terminal and the P-channel MOSFET Q65 of the CMOS inverter, the P-channel MOSFET Q67 receiving a signal generated by an inverter circuit IV3 which receives the inverted input timing signal. The P-channel MOSFET Q67 acts to prevent the bootstrap voltage being pulled toward the power-source voltage $V_{CC}$ side if the situation occurs that the signal $\phi_{bm}$ returns to the low level in synchronism with the bootstrap-start timing signal $\phi_b$ earlier than the input timing signal $\phi_{in}$. This will become obvious from the operation described later.

An output timing signal $\phi_{out}$ is obtained from the source side of the output MOSFET Q61. In order to raise the level of the output timing signal $\phi_{out}$ to higher than the power-source voltage $V_{CC}$, a bootstrap capacitor CB is provided, of which one electrode is connnected to the output terminal, and which is supplied with the bootstrap-start timing signal $\phi_b$ through the other electrode thereof. The bootstrap capacitor CB is charged through MOSFETs Q60 and Q61 and discharged through Q62 and Q63.

Figure 4:
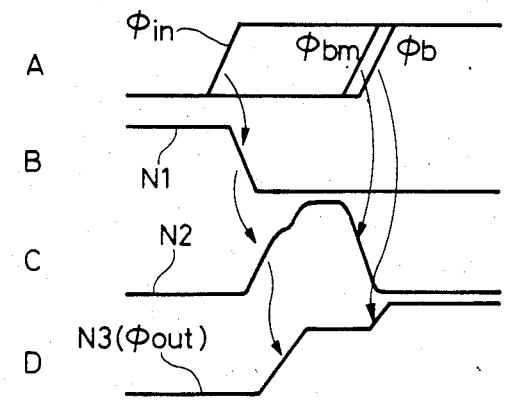
FIG. 4 is a timing chart used for illustrating the operation of this embodiment.

The operation of the bootstrap circuit of FIG. 3 will be described below with reference to the operation timing chart of FIG. 4.

When both the input timing signal $\phi_{in}$ and the bootstrap-start timing signal $\phi_b$ (and the timing signal $\phi_{bm}$) are at low level, the output MOSFET Q63 on the ground-potential side is turned on and the P-channel MOSFET Q60 on the power-source voltage side is turned off by the high level of the inverted signal (node N1) of the input timing signal $\phi_{in}$. Therefore, the output timing signal $\phi_{out}$ (node N3) reaches a low level. Since the output signal from the inverter circuit IV3 reaches a low level to turn the P-channel MOSFET Q67 on, a high-level signal is generated by the CMOS inverter circuit which receives the low-level signal $\phi_{bm}$ which is in synchronism with the bootstrap-start timing signal $\phi_b$. Therefore, a voltage of $V_{CC}-V_{th}$ is supplied to the gate of the N-channel MOSFET Q61 through the transfer-gate MOSFET Q64, so that MOSFET Q61 is turned on, the substrate thereof is supplied with the low-level signal of a node N3, and charge is precharged into the gate capacitor between the gate and the substrate (channel). In this embodiment, although there is no particular limitation thereon, an N-channel precharging MOSFET Q68 is also provided between the power-source voltage terminal $V_{CC}$ and a node N2, to precharge the node N2.

Next, when the input timing signal $\phi_{in}$ reaches a high level, the level at a node N1 changes to a low level, so that the N-channel MOSFET Q63 is turned off, and the P-channel MOSFET Q60 is turned on. As the MOSFET Q60 is turned on, the signal (output timing signal $\phi_{out}$) at node N3 becomes a high level, through the N-channel MOSFET Q61 which has been turned on. In this case, since the level at node N2, which is the gate voltage of the N-channel MOSFET Q61, has been raised to a high level (approximately $2V_{CC}-V_{th}$) which is higher than the power-source voltage by the self-bootstrap function, the potential at node N3 is raised to the level of the power-supply voltage $V_{CC}$. In this case, since MOSFET Q64 has been turned off, the raised potential at node N2 does not escape toward the power-source voltage $V_{CC}$ side.

The bootstrap capacitor CB is precharged by the power-source voltage $V_{CC}$ when the output timing signal $\phi_{out}$ reaches a high level.

When the timing signal $\phi_{bm}$ reaches a high level so that the bootstrap-start timing signal $\phi_b$ also reaches a high level, the output timing signal $\phi_{out}$ is raised to a level higher than the power-source voltage $V_{CC}$, according to the ratio of the capacitance of the bootstrap capacitor CB to that of a load capacitor that is not shown. Since the N-channel MOSFET Q66 constituting the CMOS inverter circuit is turned on by the timing signal $\phi_{bm}$, the gate voltage of the output MOSFET Q61 reaches a low level through the transfer-gate MOSFET Q64, i.e., MOSFET Q61 is turned off. Therefore, the output timing signal $\phi_{out}$ whose level has been raised does not flow back toward the power-source voltage $V_{CC}$ side and does not drop.

When the signal $\phi_{bm}$ in synchronism with the bootstrap-start timing signal $\phi_b$ reaches a low level earlier than the input timing signal $\phi_{in}$, the N-channel MOSFET Q61 is turned on earlier because of the signal generated by the CMOS inverter circuit, and the level which is increased may drop. In order to prevent this, the P-channel MOSFET Q67 is controlled by a signal which is in phase with the input timing signal $\phi_{in}$.

From the above, it can be seen that an important aspect of the present invention is the combination of a CMOS and a bootstrap capacitor connected to an output terminal of the CMOS circuit in order to reduce the power consumption and to obtain, at the output terminal, a high output voltage which exceeds the power supply voltage. If the CMOS circuit was comprised solely of a conventional CMOS arrangement, charges stored in the bootstrap capacitor CB could be discharged, at the boosting period, through the MOSFET Q60 in the CMOS circuit, which is connected between a power supply terminal and the output terminal. In order to prevent such a discharge of the bootstrap capacitor CB, the MOSFET Q61 is provided in series with the MOSFET Q60 as a switching element for preventing a reverse biasing state of the MOSFET Q60.

To give a better understanding of this prevention of reverse biasing of the MOSFET Q60, and to show alternative arrangements for doing this, FIGS. 6 through 12 illustrate further embodiments of the bootstrap circuit in accordance with the present invention. Identical numbers in these figures correspond to identical elements of FIG. 3.

Figure 6:
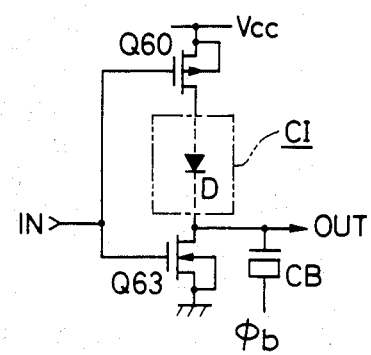
FIGS. 6 to 13 are diagrams illustrating alternative embodiments of the present invention.

Turning to FIG. 6, this shows a basic circuit of simple construction which can accomplish the fundamental object of inhibiting a reverse current bias of the transistor Q60 using a current inhibiting element CI comprising, in this case, a diode D. Although this circuit is not as effective as the preferred embodiment of FIG. 3 in terms of obtaining practical results, it does provide a good basic illustration as a starting circuit of an arrangement combining a CMOS output circuit with a bootstrap capacitor wherein provision is made to prevent reverse current bias of the charging path MOSFET of the CMOS circuit.

Figure 7:
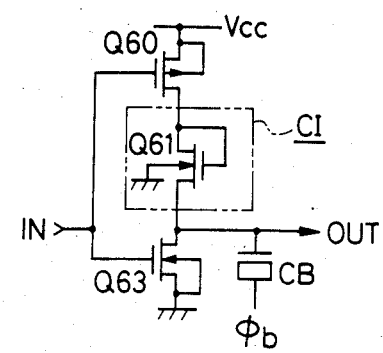
Figure 8:
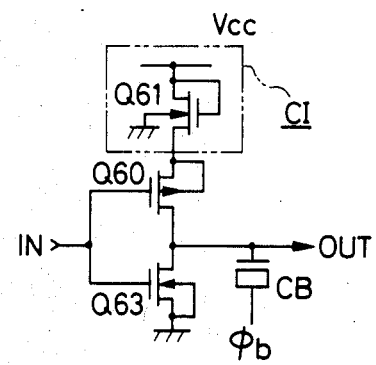
Figure 9:
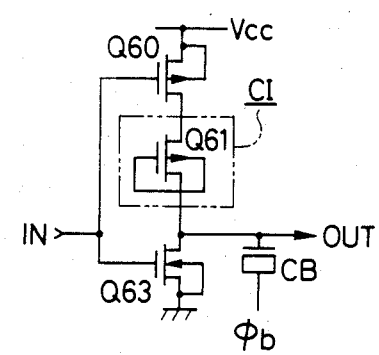
Figure 10:
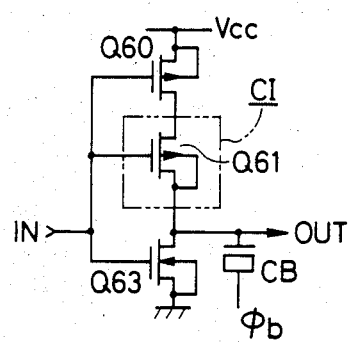
Figure 11:
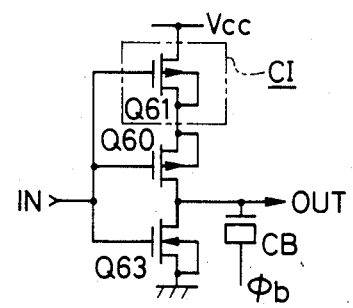

FIG. 7 illustrates a first modification of the simple starting circuit of FIG. 6 in which the diode D of the current inhibiting circuit CI has been replaced by a MOSFET Q61 of the N-channel type. FIGS. 8 through 11 show variations of this regarding different placements of the transistor Q61 and the use of a P-channel MOSFET for the transistor Q61 rather than an N-channel MOSFET. In particular, FIG. 8 shows the use of an N-channel MOSFET as Q61 located between the MOSFET Q60 and the power supply. It should be noted that this requires being able to separate the substrate gate of the P-channel MOSFETs from the power supply lines (e.g. where the P-channel MOSFETs are formed within an N-well region). FIGS. 9 through 11 illustrate three possible locations for the P-channel MOSFETs used for Q61.

In the circuit of FIG. 8, it is possible to prevent discharge of the bootstrap capacitor CB by using Q61. However, since the P-channel MOSFET Q60 is placed between the N-channel MOSFETs Q61 and Q63, it is impossible to form a common semiconductor layer of the drain Q63 and the source Q61. In the circuit of FIG. 7, on the other hand, since the drain of Q63 and the source of Q61 can be formed with a common semiconductor layer, it is possible to reduce the area of the circuit elements. However, in both the circuits of FIGS. 7 and 8, since the voltage loss or a threshold voltage $V_{th}$ arises between the drain and the source of Q61, a precharging level of the capacitor CB is reduced by a low level ($V_{CC}-V_{th}$).

Figure 12:
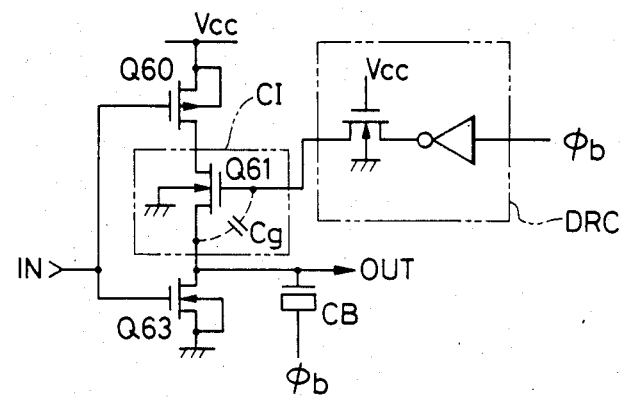

FIG. 12 illustrates a variation of FIG. 7 which is specifically designed to improve the precharging level of the bootstrap capacitor CB. In this embodiment, a driving circuit DRC comprising a cutting MOSFET and an inverter receiving the signal $\phi_b$ is provided to drive the transistor Q61. This improves the precharging level of the capacitor CB since the gate capacitance $C_G$ of the transistor Q61 acts as a boosting capacitor. Therefore, the gate potential of Q61 is increased to a level greater than $V_{CC}$.

FIG. 3 represents a further development of the embodiment of FIG. 12 wherein the driving circuit DRC is formed of the transfer MOSFET Q64 together with the CMOS inverter formed by the transistors Q65 and Q66 activated by the signal $\phi_{bm}$ in synchronization with $\phi_b$. Also, additional elements such as the delay DL and various other transistors shown in FIG. 3 are provided for the purposes discussed previously to provide a preferred overall embodiment of the present invention.

Some of the advantages of the arrangement of the foregoing embodiments are as follows:

(1) By using a CMOS output, a P-channel output MOSFET and an N-channel output MOSFET are not turned on simultaneously, and it is possible to prevent the generation of a through current in an output circuit which produces a large drive current. This makes it possible to realize a bootstrap circuit which reduces the consumption of power.

Figure 1:
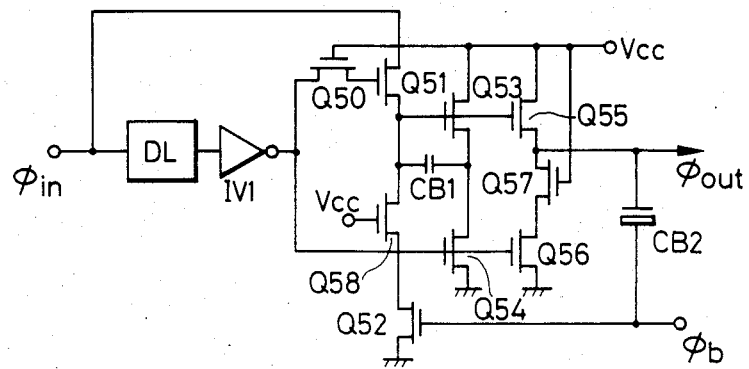
FIG. 1 is a diagram of a timing generator circuit developed prior to the present invention.

(2) Because of the reason given in (1) above, the output MOSFETs are turned on in a complementary manner to generate high-level and low-level output signals. Therefore, the output MOSFETs need have only a minimum conductance to shape the necessary drive current. Accordingly, despite the use of a CMOS circuit, the layout area can be reduced. According to calculations performed by the inventor of the present application, the circuit of FIG. 3 can be formed to a size of about 90% that of the circuit of FIG. 1.

(3) Because of the reasons given in (1) and (2) above, the consumption of power can be reduced, and a high degree of integration can be realized, if the bootstrap circuit according to the present invention is adapted to a timing generator circuit which generates word line select timing signals or data line select timing signals in a semiconductor memory device in which a memory array M-ARY is constituted by dynamic memory cells, and the peripheral circuits are constituted by CMOS static circuits.

Figure 13:
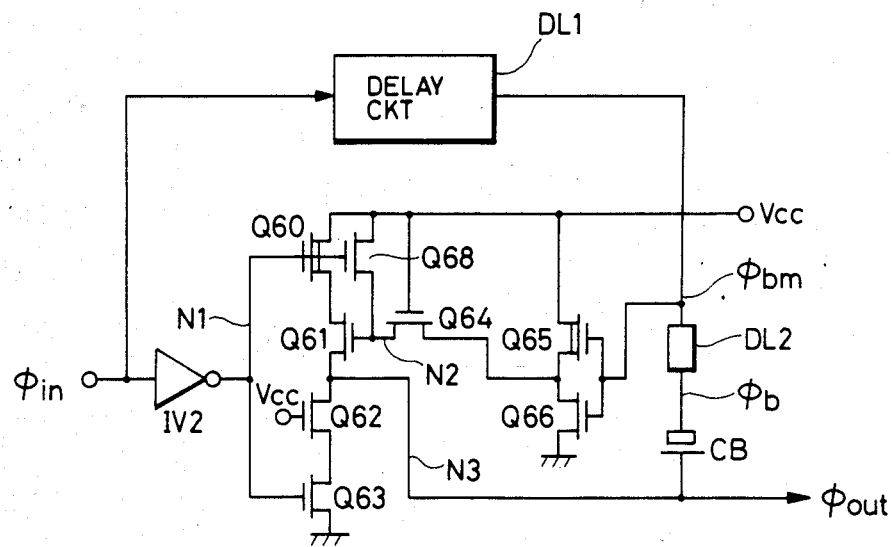

The invention accomplished by the inventor was described specifically in the foregoing by way of embodiments thereof. However, it should be noted that the invention is in no way limited to these embodiments, and can be variously modified within a scope that does not depart from the gist of the invention, For instance, to increase the withstand voltage, the MOSFETs may be constructed so as to have a high withstand voltage, or may be replaced by other circuits. If the input timing signal is formed inverted, the inverter circuit IV2 can be eliminated. Also, when the signal bm in synchronism with the bootstrap-start timing signal $\phi_b$ is formed as a delay signal of the input timing signal $\phi_{in}$ (as shown in FIG. 13), it is possible to omit the P-channel MOSFET Q67 and the inverter circuit IV3 which shapes a control signal therefor, since the signal $\phi_{bm}$ obviously will not reach a low level before the input signal $\phi_{in}$ with this arrangement. With regard to the circuit of FIG. 3, furthermore, the N-channel MOSFETs may be replaced by P-channel MOSFETs, and the P-channel MOSFETs may be replaced by N-channel MOSFETs. In this case, the polarity of the power-source voltage $V_{CC}$ should be reversed. Also, the timing signal $\phi_{bm}$ can be used as the timing signal $\phi_b$. In this case, the delay circuit DL can be omitted to reduce the number of elements.

The foregoing description dealt with the case in which the invention accomplished by the inventor is adapted to a bootstrap circuit in a semiconductor memory device such as a RAM, that served as the background of the invention. The invention, however, should in no way be limited thereto, but can be widely adapted to bootstrap circuits in the form of a variety of semiconductor integrated circuit devices made up of CMOS circuits, and which generate a level higher than the power-source voltage $V_{CC}$.

I claim:

1. A semiconductor integrated circuit comprising:
   a boosting capacitor connected between an output node and a boosting signal node for receiving a boosting signal;
   a CMOS circuit comprising a first IGFET of a first conductivity type for charging said boosting capacitor and a second IGFET of a second conductivity type for discharging said boosting capacitor, wherein said first and second IGFETs are driven complementarily by an input signal; and
   a reverse current inhibiting element connected in series with the source-drain path of said first IGFET for preventing the flow of a reverse current through said first IGFET.

2. A semiconductor integrated circuit according to claim 1, wherein said reverse current inhibiting element comprises a diode.

3. A semiconductor integrated circuit according to claim 1, wherein said reverse current inhibiting element comprises a switching element.

4. A semiconductor integrated circuit according to claim 3, wherein said switching element comprises an IGFET.

5. A semiconductor integrated circuit according to claim 1, wherein said reverse current inhibiting element comprises a third IGFET of said second conductivity type connected between the source-drain path of said first IGFET and said output node, and wherein said circuit further comprises a driving circuit coupled to said third IGFET and including means for driving said third IGFET into an off state in synchronism with a boosting signal supplied at said boosting signal node.

6. A semiconductor integrated circuit according to claim 5, further comprising a first delay circuit coupled to a driving signal node and to said boosting signal node to generate said boosting signal as a delay signal based on a driving signal at said driving signal node, and wherein said driving circuit is coupled between said driving signal node and a gate of said third IGFET to control said third IGFET in accordance with said driving signal.

7. A semiconductor integrated circuit according to claim 6, further comprising an input node for receiving said input signal, and a power switching element coupled to have a control terminal coupled to said input node and having a switch current path coupled between a first power supply terminal and said driving circuit.

8. A semiconductor integrated circuit according to claim 7, wherein said power switching element comprises an IGFET.

9. A semiconductor integrated circuit according to claim 6, wherein said driving circuit comprises a CMOS inverter having a pair of IGFETs of opposite conductivity each having its gate coupled to said driving signal node, and having their respective source-drain paths coupled in series between said first and second power supply terminals with a node between the respective source-drain paths of said IGFET pair coupled to said gate of said third IGFET.

10. A semiconductor integrated circuit according to claim 7, wherein said driving circuit comprises a CMOS inverter having a pair of IGFETs of opposite conductivity each havings its gate coupled to said driving signal node, and having their respective source-drain paths coupled in series between said first power supply terminal and a second power supply terminals with a node between the respective source-drain paths of said IGFET pair coupled to said gate of said third IGFET.

11. A semiconductor integrated circuit according to claim 5, further comprising a transfer IGFET having its source-drain path coupled between the gate of said third IGFET and said driving circuit, and having its gate coupled to a reference potential.

12. A semiconductor integrated circuit according to claim 11, wherein said transfer IGFET has its gate coupled to a first power supply terminal.

13. A semiconductor integrated circuit according to claim 11, wherein said driving circuit comprises a CMOS inverter having a pair of IGFETs of opposite conductivity each having its gate coupled to a driving signal node, and having their respective source-drain paths coupled in series between a first and second power supply terminals with a node between the respective source-drain paths of said IGFET pair coupled to said gate of said third IGFET.

14. A semiconductor integrated circuit according to claim 11, further comprising an input node for receiving said input signal, and a fourth IGFET of said second conductivity type having its gate coupled to said input node having its source-drain path coupled between a first power supply terminal and the gate of said third IGFET.

15. A semiconductor integrated circuit according to claim 1, further comprising a protecting element coupled between said output node and said source-drain path of said second IGFET.

16. A semiconductor integrated circuit according to claim 15, wherein said protecting element comprises a protecting IGFET havings its source-drain path coupled in series between said output node and the source-drain path of said second IGFET and having its gate coupled to a reference potential.

17. A semiconductor integrated circuit according to claim 16, wherein said protecting IGFET gate is coupled to a first power supply terminal.

18. A semiconductor integrated circuit according to claim 7, further comprising an inverter coupled between said input node and the control terminal of said power switching element.

19. A semiconductor integrated circuit according to claim 6, further comprising an input node for receiving said input signal, and a second delay circuit coupled between said input node and said driving signal node for generating said driving signal as a delayed signal based on said input signal.

20. A semiconductor integrated circuit according to claim 1, wherein said reverse current inhibiting element comprises a diode connected IGFET of the second conductivity type.

21. A semiconductor integrated circuit according to claim 1, wherein said reverse current inhibiting element comprises a diode connected IGFET of the first conductivity type.

22. A semiconductor integrated circuit according to claim 1, wherein said reverse current inhibiting element comprises a third IGFET having a gate coupled to the gates of said first and second IGFETs and having its source-drain path coupled in series with the source-drain paths of said first and second IGFETs.

23. A semiconductor integrated circuit according to claim 22, wherein said third IGFET is of said first conductivity type.

24. A semiconductor integrated circuit according to claim 1, wherein said reverse current inhibiting element is connected in series between said first IGFET and a first power supply terminal.

25. A semiconductor integrated circuit according to claim 1, wherein said reverse current inhibiting element is connected in series between the first IGFET and the output node.

26. A semiconductor integrated circuit according to claim 24, wherein said reverse current inhibiting element is an IGFET of the first conductivity type.

27. A semiconductor integrated circuit according to claim 24, wherein said reverse current inhibiting element is an IGFET of the second conductivity type.

28. A semiconductor integrated circuit according to claim 25, wherein said reverse current inhibiting element is an IGFET of the first conductivity type.

29. A semiconductor integrated circuit according to claim 25, wherein said reverse current inhibiting element is an IGFET of the second conductivity type.

30. A semiconductor integrated circuit comprising:
a boosting capacitor connected between an output node of said semiconductor integrated circuit and a boosting signal node for receiving a boosting signal;
a CMOS circuit comprising a first IGFET of a first conductivity type for charging said boosting capacitor and a second IGFET of a second conductivity type for discharging said boosting capacitor, wherein said first IGFET has a gate coupled to an input node and has its source-drain path connected in series between a first power supply terminal and said output node, and wherein said second IGFET has a gate coupled to said input node and has its source-drain path connected in series between a second power supply terminal and said output node:
a third IGFET of said second conductivity type connected between the source-drain path of said first IGFET and said output node and a driving circuit coupled to a gate of said third IGFET and including means for driving said third IGFET into an off state in synchronism with a boosting signal supplied at said boosting signal node to control said third IGFET to prevent the flow of a reverse current through said first IGFET;
a first delay circuit coupled between a driving signal node and said boosting signal node to generate a boosting signal as a delayed signal based on said driving signal applied to said driving signal node, wherein said driving circuit is coupled between said driving signal node and a gate of said third IGFET to control said third IGFET in accordance with said driving signal and wherein said driving circuit comprises a CMOS inverter having a pair of IGFETs of opposite conductivity each having a gate coupled to said driving signal node and having their respective source-drain paths coupled in series between said first and second power supply terminals with a node between the respective source-drain paths of said IGFET pair coupled to said gate of said third IGFET:

a transfer IGFET having its source-drain path coupled between the gate of said third IGFET and said driving circuit, and having its gate coupled to a reference potential; and a protecting element coupled between said output node and the source-drain path of said second IGFET.

31. A semiconductor integrated circuit device including a bootstrap circuit which comprises:

a first MOSFET of a first conductivity type which receives an input timing signal through the gate thereof, and of which the source is connected to a power-source voltage terminal:

a switching MOSFET of a second conductivity type which is connected in series with said first MOSFET;

a transfer-gate MMSFET of said second conductivity type which is connected to the gate of said switching MOSFET and to an output node of a CMOS inverter circuit including a pair of MOSFETS of opposite conductivity types to one another which receives a signal that is in synchronism with a bootstrap-start timing signal, the gate of said transfer-gate MOSFET being connected to said power-source voltage terminal;

a second MOSFET of said second conductivity type which is connected between the source of said switching MOSFET and a ground-potential point, and which receives said input timing signal through the gate thereof; and a bootstrap capacitor of which one terminal is connected to the source of said switching MOSFET to provide an output signal node and which is supplied with said bootstrap-start timing signal through the other terminal thereof.

32. A semiconductor integrated circuit device according to claim 31, wherein a third MOSFET of said first conductivity type is connected between one of said pair of MOSFETS in said CMOS inverter circuit on the power-source voltage side and said power source voltage terminal, the gate of said third MOSFET being supplied with an inverted signal of said input timing signal.

33. A semiconductor integrated circuit according to claim 1, wherein said semiconductor integrated circuit is coupled to receive input timing signals at an input node and produces output timing signals at said output node, and wherein said output node is coupled to control the timing of selection circuitry of a semiconductor memory array to select predetermined address locations within said memory array.

34. A semiconductor integrated circuit according to claim 30, wherein said semiconductor integrated circuit is coupled to receive input timing signals at an input node and produces output timing signals at said output node, and wherein said output node is coupled to control the timing of selection circuitry of a semiconductor memory array to select predetermined address locations within said memory array.

35. A semiconductor integrated circuit device according to claim 31, wherein said output node is coupled to control the timing of selection circuitry of a semiconductor memory array for selecting predetermined address locations within said memory array.

36. A semiconductor integrated circuit according to claim 21, wherein said diode connected IGFET has a substrate gate connected to a gate thereof.

37. A semiconductor integrated circuit according to claim 23, wherein said third IGFET has a substrate gate connected to a drain thereof.

* * * * *